US012422743B2

(12) United States Patent
Capelli et al.

(10) Patent No.: US 12,422,743 B2
(45) Date of Patent: Sep. 23, 2025

(54) METHOD FOR MEASURING A REFLECTIVITY OF AN OBJECT FOR MEASUREMENT LIGHT AND METROLOGY SYSTEM FOR CARRYING OUT THE METHOD

(71) Applicant: Carl Zeiss SMT GmbH, Oberkochen (DE)

(72) Inventors: Renzo Capelli, Heidenheim (DE); Markus Koch, Neu-Ulm (DE); Dirk Hellweg, Langenau (DE); Walter Pauls, Huettlingen (DE); Grizelda Kersteen, Ulm (DE); Klaus Gwosch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 784 days.

(21) Appl. No.: 17/721,750

(22) Filed: Apr. 15, 2022

(65) Prior Publication Data
US 2022/0236648 A1 Jul. 28, 2022

Related U.S. Application Data

(63) Continuation of application No. PCT/EP2020/078215, filed on Oct. 8, 2020.

(30) Foreign Application Priority Data
Oct. 17, 2019 (DE) .......................... 102019215972.9

(51) Int. Cl.
*G03F 1/84* (2012.01)
*G01N 21/33* (2006.01)
(Continued)

(52) U.S. Cl.
CPC ............... *G03F 1/84* (2013.01); *G01N 21/33* (2013.01); *G01N 21/55* (2013.01);
(Continued)

(58) Field of Classification Search
CPC ...... G01N 21/33; G01N 21/55; G01N 21/956; G01N 2021/555; G01N 2021/559;
(Continued)

(56) References Cited

U.S. PATENT DOCUMENTS

| 5,808,312 A | 9/1998 | Fukuda |
| 2002/0030826 A1 | 3/2002 | Chalmers et al. |

(Continued)

FOREIGN PATENT DOCUMENTS

| DE | 102013208565 | 3/2014 | ............. G01N 21/55 |
| DE | 102015215559 | 2/2017 | ............. G01N 21/55 |

(Continued)

OTHER PUBLICATIONS

The International Search Report for International Application No. PCT/EP2020/078215, dated Dec. 18, 2020.
(Continued)

Primary Examiner — Gordon J Stock, Jr.
(74) Attorney, Agent, or Firm — Fish & Richardson P.C.

(57) ABSTRACT

When measuring a reflectivity of an object for measurement light, initially the object and a reflectivity measurement apparatus are provided. The latter includes a measurement light source, an object holder for holding the object and a spatially resolving detector for capturing measurement light reflected by the object. A measurement light beam impinges on a section of the object within a field of view of the measurement apparatus. The reflected measurement light coming from the impinged-upon section of the object is captured. A surface area of the captured section is at most 50 μm×50 μm. The measurement is performed by the detector.

(Continued)

Next, at least one reflectivity parameter of the object is determined on the basis of an intensity of the captured measurement light. The result is a measurement method and a metrology system operating therewith, whereby reflectivities in particular of very finely structured objects, such as lithography masks, can be measured with sufficient precision.

18 Claims, 6 Drawing Sheets

(51) Int. Cl.
    *G01N 21/55*     (2014.01)
    *G01N 21/956*     (2006.01)
    *G03F 7/00*     (2006.01)

(52) U.S. Cl.
    CPC ...... *G03F 7/70608* (2013.01); *G03F 7/70616* (2013.01); *G01N 2021/95676* (2013.01)

(58) Field of Classification Search
    CPC ............ G01N 2021/95676; G03F 1/84; G03F 7/70605; G03F 7/70608; G03F 7/70616; G03F 7/70625; G03F 7/7065; G03F 7/70653; G03F 7/706843; G03F 7/706849; G03F 7/706851
    See application file for complete search history.

(56) References Cited

U.S. PATENT DOCUMENTS

| | | | |
|---|---|---|---|
| 2003/0043370 | A1 | 3/2003 | Goldberg |
| 2004/0165165 | A1* | 8/2004 | Yun ........................... G03F 1/84 378/34 |
| 2012/0162755 | A1 | 6/2012 | Stroessner et al. |
| 2013/0330847 | A1 | 12/2013 | Tsai et al. |
| 2015/0116717 | A1 | 4/2015 | Manassen et al. |
| 2016/0274029 | A1* | 9/2016 | Bol .................... G02B 19/0095 |
| 2019/0302010 | A1 | 10/2019 | Porter et al. |
| 2019/0391087 | A1* | 12/2019 | Matejka ............. G01B 9/02083 |

FOREIGN PATENT DOCUMENTS

| | | | |
|---|---|---|---|
| JP | H06-230200 | 8/1994 | ............... G21K 7/00 |
| JP | H09-090607 | 4/1997 | ............... G03F 1/08 |
| JP | H10-318945 | 12/1998 | ............. G01N 23/20 |
| JP | 2013-504774 | 2/2013 | ............... G03F 1/84 |
| WO | WO 2006/080909 | 8/2006 | ............. G01N 21/55 |
| WO | WO 2017/207297 | 12/2017 | ............... G03F 1/84 |
| WO | WO 2018/218092 | 11/2018 | ............... G03F 1/26 |

OTHER PUBLICATIONS

The Office Action cited by the German Patent Office for Application No. DE 102019215972.9, dated May 5, 2020 (with English Translation).

"Avogadro constant re-measured", *PTB News Edition 03.1*, published by Physikalisch-Technische-Bundesanstalt (National Metrology Institute of Germany) (Mar. 2003).

Hellweg et al., "Actinic Review of EUV Masks: Performance Data and Status of AIMS™ EUV System", *Proceedings of SPIE*, vol. 10143, pp. 101430J-1-101430J-12 (Mar. 24, 2017).

Nozawa et al., "Phase-shift/Transmittance measurements in a micro pattern using MPM193EX", *Proceedings of SPIE*, vol. 7379, pp. 737925-1-737925-10 (2009).

Perlitz et al., "Phame™: a novel phase metrology tool of Carl Zeiss for in-die phase measurements under scanner relevant optical settings", *Proceedings of SPIE*, (Mar. 2007).

Van den Broek et al., "Method for Retrieval of the Three-Dimensional Object Potential by Inversion of Dynamical Electron Scattering", *Physical Review Letters*, vol. 109 (2012).

The Notification of Grounds for Refusal issued by the Japanese Patent Office for Application No. JP 2022-522862 by Examiner Hidenao Tanaka, dated May 29, 2023 (with English Translation).

The Office Action issued by the Korean Patent Office for Application No. KR 10-2022-7016383, dated Feb. 1, 2024 (with English Translation).

The Office Action issued by the Japanese Patent Office for Application No. JP 2024-015548 dated Nov. 28, 2024 (with English Translation).

\* cited by examiner

US 12,422,743 B2

METHOD FOR MEASURING A REFLECTIVITY OF AN OBJECT FOR MEASUREMENT LIGHT AND METROLOGY SYSTEM FOR CARRYING OUT THE METHOD

CROSS-REFERENCE TO RELATED APPLICATIONS

This application is a continuation of and claims priority under 35 U.S.C. § 120 from PCT Application No. PCT/EP2020/078215, filed on Oct. 8, 2020, which claims priority from German Application No. 10 2019 215 972.9, filed on Oct. 17, 2019. The entire contents of each of these priority applications are incorporated herein by reference.

TECHNICAL FIELD

The invention relates to a method for measuring a reflectivity of an object for measurement light. The invention further relates to a metrology system for carrying out this method.

BACKGROUND

For measuring reflectivities of objects, reflectometers that illuminate an extended section of an object that is to be determined in terms of its reflectivity are known. Reflectometers are known in a variety of designs for various applications. A reflectometer for EUV lithography is known from PTB News edition 03.1, 2003, published by the Physikalisch-Technische Bundesanstalt (National Metrology Institute of Germany).

SUMMARY

It is an aspect of the present invention to develop a method for measuring a reflectivity of an object for measurement light such that reflectivities in particular of very finely structured objects, for example of lithography masks, can be measured thereby with sufficient precision.

This aspect is achieved according to the invention by a measurement method having the features specified in claim 1.

It has been found in accordance with one aspect of the invention that it is necessary for a sufficiently precise determination of a reflectivity parameter to measure object surface sections of very small extent that are not larger than 50 μm×50 μm. In particular local reflectivity variations that could be decisive for the function of the object to be measured can be determined precisely in this way.

A capturing region of the reflected measurement light with the reflectivity measurement apparatus is also referred to as field of view. The field of view of capturing can be smaller than 50 μm×50 μm and can be, for example, 40 μm×40 μm, 30 μm×30 μm, 25 μm×25 μm, 20 μm×20 μm, 15 μm×15 μm or 10 μm×10 μm or be even smaller. The field of view is regularly larger than 1 μm×1 μm. The measurement light beam that impinges on the object section can have a correspondingly larger diameter ranging from 1 μm to 100 μm. The field of view regularly lies within the measurement light beam diameter. The object section on which the measurement light impinges can coincide with the field of view or lie within the field of view.

Before the measurement light beam impinges on the object section, a selection of an object section that is to be processed can be made on the basis of structure details of the object, for example targeted impingement on reflective sections of an object that also has absorbing sections or a targeted selection of specific, possibly repeating object structures. The object is a structured lithography mask or an as yet unstructured mask (mask blank). If a lithography mask is used as the object, it may or may not have a pellicle. In particular, a lithography mask that is to be used for EUV projection exposure lithography can be measured.

The detector can be arranged in a field plane. In this case, the field of view is imaged into the detection or measurement plane.

In some implementations, the reflectivity parameter can be determined individually for exactly one object and in particular for one or more defined sections of exactly one object. Alternatively a comparison of reflectivity parameters of different objects, in particular different lithography masks or reticles, can also take place. To this end, an object to be measured can be compared to a calibration object that was calibrated in advance. The reflectivity parameter determined can be an absolute object reflectivity, for example. To this end, a comparison with the corresponding reflectivity parameter of a calibration object or normalization object can take place. When measuring a lithography mask, a transmission of a pellicle of the mask can also be determined, in particular locally. A comparison of corresponding reflection measurements of the object with and without a pellicle can be made, in particular locally in one or more object pellicle sections. An influence of the pellicle on the reflectivity of an object section can be determined.

A spatial resolution of the detector within the field of view can be better than 100 nm, can be better than 80 nm, can be better than 60 nm, can be better than 50 nm, can be better than 40 nm, can be better than 30 nm, can be better than 25 nm, can be better than 20 nm, and can lie in the range, for example, between 1 nm and 10 nm.

In particular, there can be a qualification of lithography masks as an example of the object to be measured to the effect that the reflectivity thereof corresponds to specific homogeneity criteria. This takes account of the fact that intensity fluctuations of reflected illumination light during the projection exposure are included linearly in a variation of an attainable critical dimension, that is to say in an attainable spatial resolution of the projection exposure. Such a dependence between corresponding intensity fluctuations ΔI and the variation of the attainable critical dimension, ΔCD, can be written as follows:

$$\frac{\Delta CD}{CD} = \frac{2}{NILS} \frac{\Delta I}{I}$$

CD is here the critical dimension, I is the intensity reflected by the object to be measured, for example of an as yet unstructured mask, and NILS is a constant system parameter (normalized image log slope parameter).

A determination of a local reflectivity variation as claimed in claim 2 makes it possible to find deviations of pre-specified values of the reflectivity that might negatively affect the function of the lithography mask as an example of the object to be measured.

A determination of a reflectivity variation of different object sections as claimed in claim 3 can be achieved by sequentially capturing the different sections, wherein the object is displaced relative to the measurement light beam transversely to a beam direction in the measurement plane. It is also possible for an entire surface of the object that is to be measured to be measured in this manner. The different object sections can be structured and/or unstructured object sections.

A determination of an angle variation of the reflectivity as claimed in claim 4 permits testing of specific illumination settings, which are used in particular during a projection exposure of a lithography mask as an example of the object to be measured, with respect to the reflectivities of the mask for the specific illumination directions of said setting. It is possible hereby for a lithography mask to be qualified for specific illumination settings.

Sequential impingement as claimed in claim 5 can be achieved via a displaceable pinhole stop in an illumination pupil of an illumination optical unit of the reflectivity measurement apparatus.

Simultaneous impingement as claimed in claim 6 can be achieved by capturing an image of a pupil after reflection of the measurement light at the object. In order to allow capturing of the pupil image in the measurement plane in addition to the possibility of imaging the field of view into the measurement plane, the reflectivity measurement apparatus can have in the measurement light beam path between the object and the detector a Bertrand optical unit, which can be displaced between an inactive position and an active position.

A signal strength normalization as claimed in claim 7 allows an absolute determination of reflectivity parameter values. A calibration object or normalization object with a known reflectivity parameter can be used during the normalization.

The advantages of a metrology system as claimed in claim 8 correspond to those that have already been explained above with reference to the reflectivity measurement method. A metrology system known in principle from the prior art can be used for mask qualification. A metrology system of this type is described for example in the technical paper "Actinic review of EUV masks: Performance data and status of the AIMS™ EUV system", Proc. SPIE 10143, Extreme Ultraviolet (EUV) Lithography VIII, 101430J (Mar. 24, 2017) by D. Hellweg et al.

Using an EUV measurement light source as claimed in claim 9, an actinic measurement can be made in which a measurement light wavelength matches the one that is also used during a projection exposure of a lithography mask.

A pinhole stop as claimed in claim 10, which is arranged in particular so as to be displaceable in an illumination pupil of the illumination optical unit of the metrology system, permits the measurement of a reflectivity for a specific illumination angle.

The advantages of a Bertrand optical unit as claimed in claim 11 have already been explained above in connection with the measurement method.

An energy sensor or a plurality of energy sensors as claimed in claim 12 permits normalization of a measurement light signal strength. In particular, influences of the light source and of the illumination optical unit on the signal strength can be eliminated. Alternatively or in addition thereto, any influence of an illumination setting on the signal strength can be eliminated. Mask and/or pellicle effects can be measured precisely. Structure effects between different structured mask sections can also be assigned without bothersome apparatus influences being present here.

BRIEF DESCRIPTION OF DRAWINGS

Exemplary embodiments of the invention are explained in greater detail below with reference to the drawings. In said drawings.

DETAILED DESCRIPTION

Figure 1:
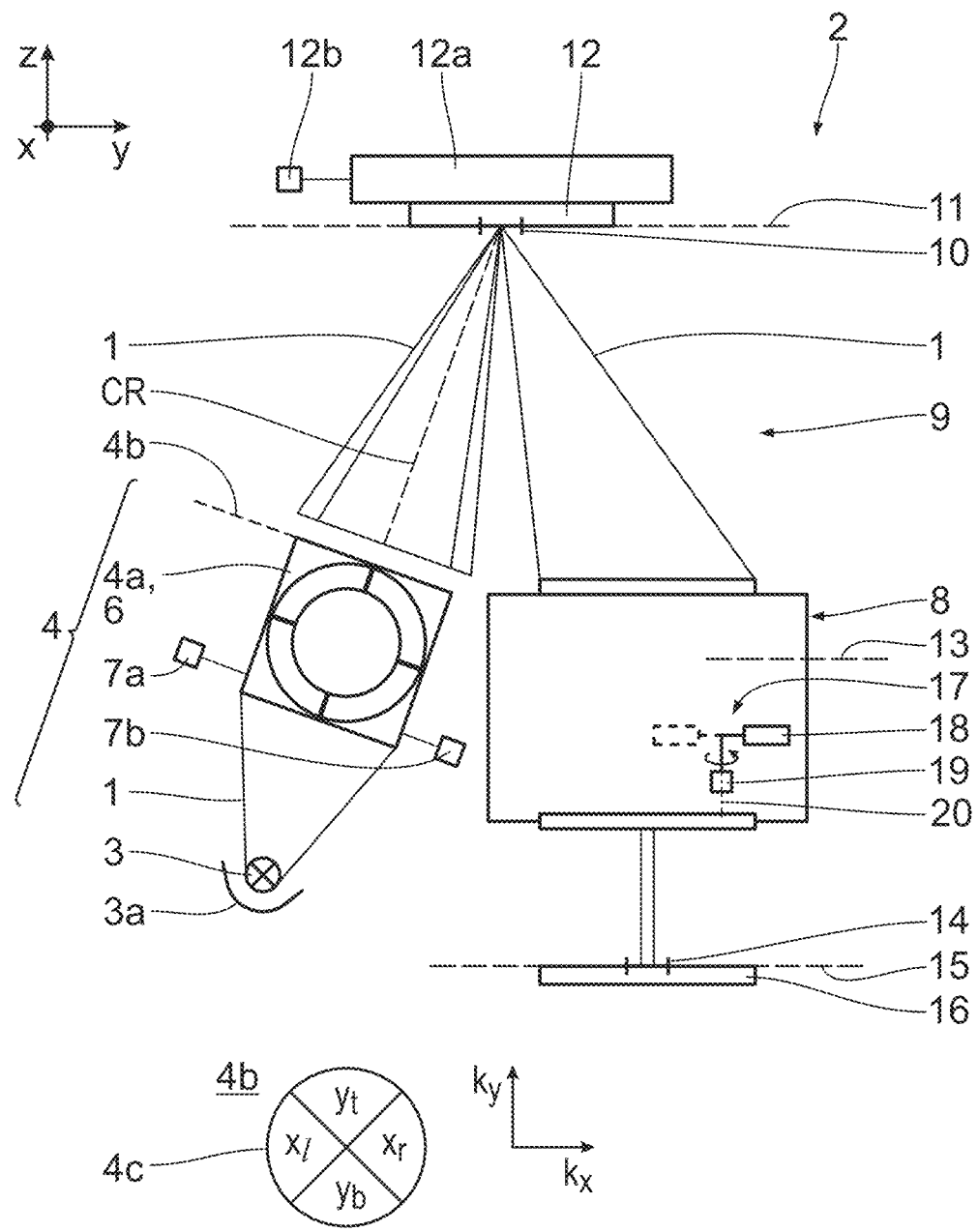
FIG. 1 schematically shows a metrology system, embodied as a reflectivity measurement apparatus for measuring reflectivity of an object to be measured in the form of a lithography mask, having an illumination system, an imaging optical unit, and a spatially resolving detection device.

FIG. 1 shows, in a sectional view corresponding to a meridional section, a beam path of EUV illumination light or EUV imaging light 1 in a metrology system 2, which is embodied in the form of a reflectivity measurement apparatus. The illumination light 1 is produced by an EUV light source 3. The illumination light 1 is also referred to as measurement light.

In order to facilitate the representation of positional relationships, a Cartesian xyz-coordinate system is used hereinafter. The x-axis in FIG. 1 extends perpendicular to the plane of the drawing and out of the latter. The y-axis in FIG. 1 extends toward the right. The z-axis in FIG. 1 extends upwardly.

The light source 3 can be a laser plasma source (LPP; laser produced plasma) or a discharge source (DPP; discharge produced plasma). In principle, a synchrotron-based light source can also be used, for example a free electron laser (FEL). A used wavelength of the illumination light 1 can be in the range of between 5 nm and 30 nm. In principle, in the case of a variant of the projection exposure apparatus 2, it is also possible to use a light source for some other used light wavelength, for example for a used wavelength of 193 nm. The measurement light 1 of the light source 3 is collected by a collector 3a. The collector can here be, for example, an ellipsoidal collector or a nested collector.

The illumination light 1 is conditioned in a schematically illustrated illumination optical unit 4a of an illumination system 4 of the metrology system 2, of which the light source 3 is also a part, in a manner such that a specific illumination setting of the illumination is provided, that is to say a specific illumination angle distribution. A specific intensity distribution of the illumination light 1 in an illumination pupil of the illumination optical unit 4a of the illumination system 4 corresponds to said illumination setting.

One example of the illumination setting is indicated schematically in plan view in FIG. 1 in a manner lying in the plane of the drawing as an annular illumination setting provided with webs and having a plurality of, specifically four, illumination poles. The illumination pupil in which the illumination setting is present is in fact arranged perpendicularly to the plane of the drawing in FIG. 1 and perpendicularly to the direction of propagation of the illumination light 1 through the illumination pupil. An arrangement plane of the illumination pupil that coincides with the pupil plane of the illumination optical unit 4a is indicated in dashes in FIG. 1 at 4b and is perpendicular to the plane of the drawing of FIG. 1. Pupil coordinates $k_x$, $k_y$ in the pupil plane 4b correspond to the illumination angles of the object illumination with the measurement light 1. In the illumination pupil there is a predefined illumination intensity in each case at the location of the illumination poles, otherwise no illumination intensity.

FIG. 1 shows, in an insert, a division of an illumination pupil 4c in the pupil plane 4b into four quadrants $x_l$, $x_r$, $y_t$, $y_b$ used for the determination of pupil parameters of the illumination. $x_l$ and $x_r$ here represent the two left and right quadrants along the pupil coordinate $k_x$ and $y_t$, $y_b$ represent the top and bottom quadrants along the further pupil coordinate $k_y$.

Depending on the intensity of the illumination light 1 that passes through said quadrants $x_l$, $x_r$, $y_t$, $y_b$ in the pupil 4c, the following illumination parameters that characterize the illumination angle distribution can be determined.

$$\text{Ellipticity} = \frac{|(x_l + x_r) - (y_t + y_b)|}{(x_l + x_r) + (y_t + y_b)}$$

$$PB_x = \frac{|x_l - x_r|}{x_l + x_r}$$

$$PB_y = \frac{|y_t - y_b|}{(y_t + y_b)}$$

$PB_x$ and $PB_y$ here denote a pole balance along the pupil coordinates $k_x$, $k_y$.

The illumination setting can be specified by a setting stop 6, which is transmissive to the illumination light 1 at the location of the illumination poles and blocks the illumination light in the surroundings of the illumination poles. One example of such a setting stop 6 is a metal sheet having through openings, the shape of which corresponds exactly to the shape of the illumination poles. The setting stop 6 is arranged in the pupil plane 4b of the illumination optical unit 4a of the metrology system 2.

With the aid of a changing holder 7a indicated in FIG. 1, the setting stop 6 can be exchanged for an exchange setting stop for changing the respective measurement illumination setting. Alternatively or in addition to such a changing holder 7a, the setting stop can be designed to be displaceable in the pupil plane 4b with the aid of a displacement drive 7b.

Instead of the quadrupole illumination setting illustrated by way of example, it is also possible by using further setting stops with differently shaped and/or distributed through openings to specify other illumination settings within the metrology system 2, for example a conventional illumination setting in which practically all illumination angles are used for object illumination, in particular with the exception of illumination angles close to normal or central incidence on the object to be illuminated, an annular illumination setting with small illumination angles overall, that is to say illumination angles close to normal or central incidence, which itself can in turn be omitted, or dipole illumination settings, wherein the individual poles can each have a "leaflet" contour, that is to say a peripheral contour that corresponds approximately to the section through a biconvex lens element. A pinhole stop can also be used as a setting stop of that type, as will be explained hereinafter.

Together with an imaging optical unit or projection optical unit 8, the illumination system 4 constitutes an optical measurement system 9 of the metrology system 2.

With the illumination setting that is respectively set, the illumination light 1 illuminates an object field 10 of an object plane 11 of the metrology system 2. A lithography mask 12, also referred to as a reticle, is arranged as an example of a reflective object in the object plane 11. As an alternative to such a structured object, an unstructured object can also be measured, for example a mask blank. It is also possible for different sections of the object 12 to be measured, of which for example one section is structured and one section is unstructured.

Figure 6:
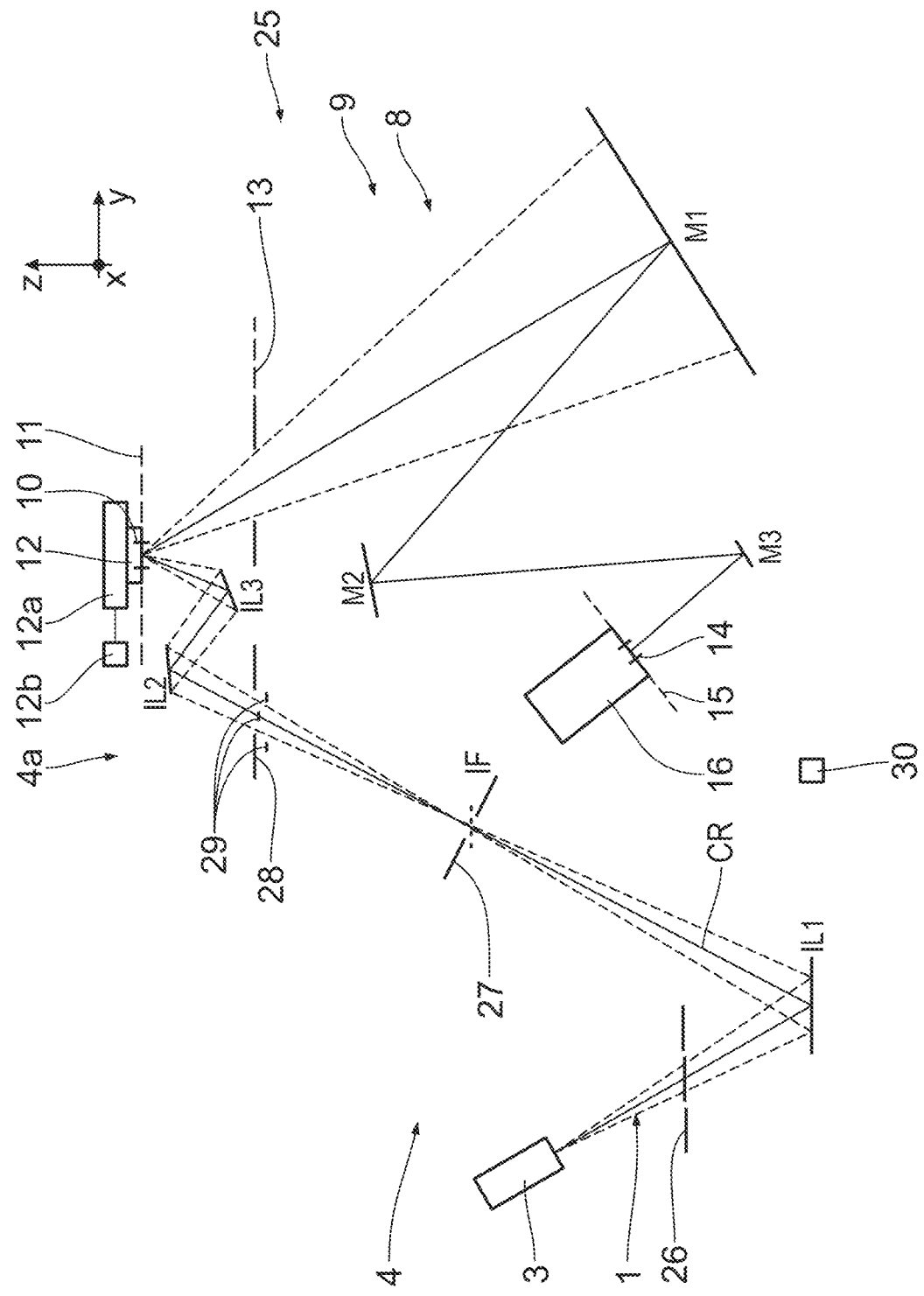
FIG. 6 likewise schematically illustrates a further embodiment of the metrology system, having energy sensors, arranged in the region of a pupil plane of the illumination system, wherein a lithography mask without pellicle is measured as the object.

An object holder and an object displacement drive are not illustrated in FIG. 6 but are also present correspondingly in the metrology system 25 in the above statements relating to the metrology system 2.

The object plane 11 extends parallel to the x-y-plane. The object field 10 simultaneously constitutes a field of view of the projection optical unit 8 or of the metrology system 2.

The object 12 is carried by an object holder 12a, which is illustrated schematically in FIG. 1. The object 12 can be displaced in the object plane 11 in at least two translational degrees of freedom with the aid of an object displacement drive 12b, which cooperates with the object holder 12a. In this way, in particular a selection of a section of the object 12 that is to be measured can be made. A further degree of freedom of displacement provided by the object displacement drive 12b lies perpendicular to the object plane 11, that is to say along the z-direction.

The illumination light 1 is reflected by the lithography mask 12, as illustrated schematically in FIG. 1, and enters an entrance pupil of the imaging optical unit 8 in a pupil plane 13. The pupil plane 13 is indicated schematically within the projection optical unit 8 in FIG. 1. The pupil used of the imaging optical unit 8 can have a circular or elliptic boundary.

The imaging optical unit 8 images the object field 10 in an operating situation of the metrology system 2 into an image field or measurement field 14 in an image plane or measurement plane 15 of the metrology system 2. A magnifying imaging scale during the imaging by the projection optical unit 8 is greater than 500. Depending on the embodiment of the projection optical unit 8, the magnifying imaging scale can be greater than 100, can be greater than 200, can be greater than 250, can be greater than 300, can be greater than 400 and can also be significantly greater than 500. The imaging scale of the projection optical unit 8 is regularly less than 2000.

The projection optical unit 8 serves for imaging a section of the object 12, which section is arranged in the object field 10, into the image plane 15.

A spatially resolving detection device 16 of the metrology system 2 is arranged in the image plane or measurement plane 15. This detection device can be a CCD camera. Accordingly, the image field 14 will also be referred to as measurement field hereinafter. The detection device 16, which is also referred to as a detector, serves for capturing measurement light 1 reflected by the object 12.

The field of view 10 has an extent in the x-y-plane that is smaller than 50 µm×50 µm, for example 10 µm×10 µm.

The detector 16 can have for example in the measurement field 14 a resolution of 1000×1000 pixels.

A spatial resolution of the detector 16 within the field of view 10 can be better than 100 nm and be for example in the range between 1 nm and 10 nm.

To expand the functionality of the projection optical unit 8, the latter can have a Bertrand optical unit 17, which is schematically indicated in FIG. 1. The Bertrand optical unit 17 has a Bertrand mirror 18. The latter cooperates with a repositioning drive 19 and is thereby repositionable between an inactive position, illustrated in a solid line in FIG. 1, and an active position, illustrated in dashed lines in FIG. 1. Repositioning as indicated in FIG. 1 can be effected for example by pivoting a holder of the Bertrand mirror about a pivot axis 20.

In the inactive position of the Bertrand mirror, the latter does not influence a beam path of the measurement light 1, with the result that the projection optical unit 8 images the object field or field of view 10 into the image field 14 in the measurement plane 15. The measurement plane 15 is then a field plane.

In the active position of the Bertrand mirror 18, the latter changes the beam path of the measurement light 1 between the object field or field of view 10 and the measurement field 14 such that the object plane 11 is transferred at the location of the measurement plane 15 not into a field plane, but into a pupil plane. The measurement field 14 then represents a pupil, and an impingement on the spatially resolving detector 16 with intensity is a measure of an illumination angle distribution of the section of the object 12 illuminated in the object field 10 and thus a measure of an illumination-angle-dependent reflectivity of said object section.

As far as the fundamental function is concerned, such a Bertrand optical unit is known from the literature relating to light microscopes. A Bertrand optical unit of this type is also referred to as phase telescope.

Figure 2:
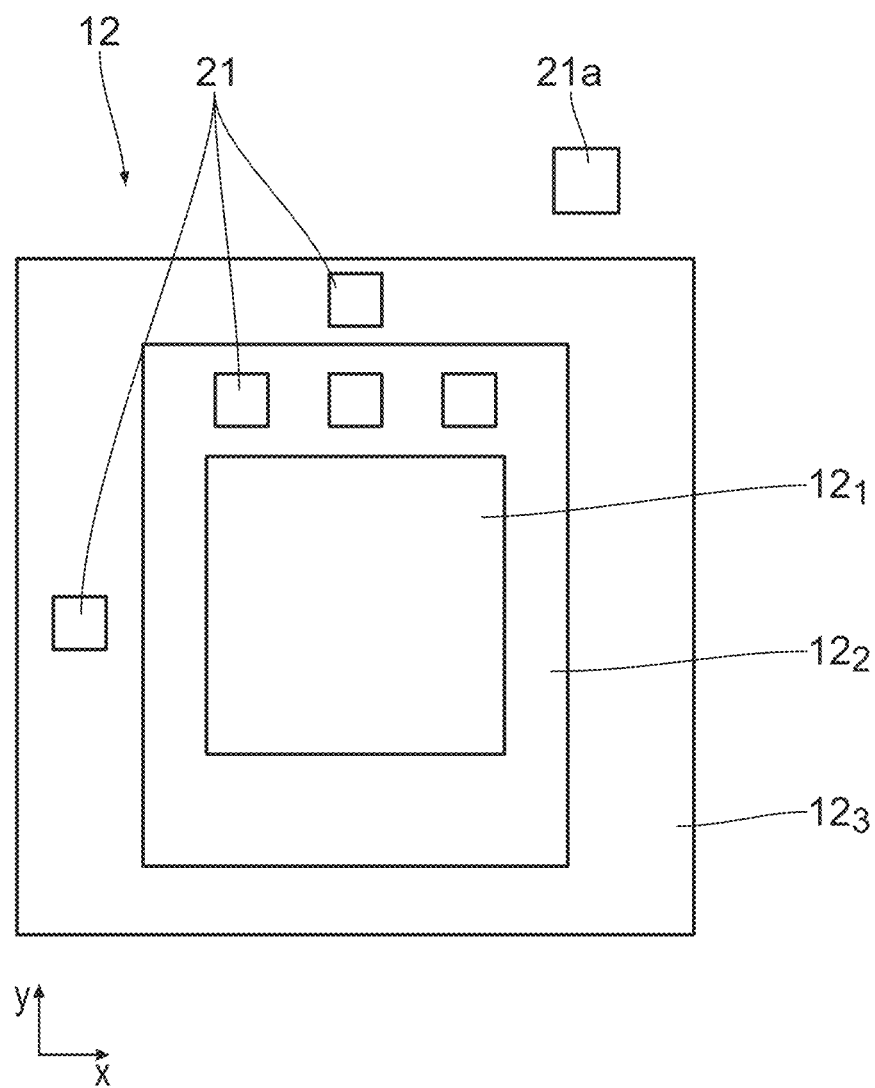
FIG. 2 shows a plan view of a structured object to be measured by way of the example of a lithography mask.

FIG. 2 shows by way of example an embodiment of a lithography mask 12 that is to be measured. The latter is divided into a central zone $12_1$, in which a structuring is provided that is imaged onto a wafer to be structured during the use of the lithography mask during the projection exposure. This central zone $12_1$ is approximately square.

The central zone $12_1$ is surrounded by a transition zone $12_2$ with a maximum reflectivity for the illumination light 1 that is reduced compared to the central zone $12_1$. Reflection sections 21 can be arranged at the location of the transition zone $12_2$ for determining a signal strength of the measurement light 1 impinging on the object 12. In addition to the measurement light bundle 1 impinging on the field of view 10, the illumination system 4 can be designed such that at least one of the reflection sections 21 on the object 12 is impinged upon with the aid of at least one further measurement light bundle. The respective further measurement light bundle is then guided from the reflection sections 21 to at least one energy sensor 21a for the measurement light signal strength determination.

Such energy sensors 21a, which are illustrated schematically in FIG. 2, can be arranged on a spatially fixed component of the measurement apparatus 2, which is not displaced when the object 12 is displaced.

The transition zone $12_2$ is designed to extend around an outer periphery of the central zone $12_1$. The transition zone $12_2$ in turn is surrounded by a peripheral zone $12_3$ of the object 12. The latter serves for cooperating with the object holder 12a and is generally designed to be non-reflective, but can likewise carry reflection sections 21, as indicated in FIG. 2.

A maximum reflection of the central zone $12_1$ can lie in the range between 60% and 70% of the incident measurement light 1. A maximum reflection of the transition zone $12_2$ can lie in the range between 55% and 65% of the incident measurement light 1.

Figure 3:
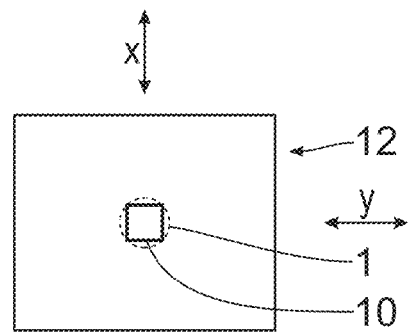
FIG. 3 schematically shows, again in plan view, the object to be measured, wherein a measurement beam impinges on a section of said object within a field of view of the measurement apparatus for the reflectivity measurement.

FIG. 3 shows by way of example size ratios between an incident bundle of the measurement light 1 and the object field or field of view 10. A diameter of the measurement light bundle 1, which is illustrated in dashes in FIG. 3, is so large that the field of view 10 lies entirely within the measurement light bundle 1. The field of view 10 is indicated by a square in FIG. 3. In principle, the field of view 10 can also have a different peripheral contour, for example a rectangular peripheral contour, a round/elliptic peripheral contour or a peripheral contour that is adapted to an object field of a projection exposure apparatus and corresponds to the latter, for example an arcuate field peripheral contour.

FIG. 3 furthermore indicates the translational degrees of freedom x and y of the object displacement drive 12b. A section on the object 12 that is to be measured can be thereby selected in which it is positioned into the field of view 10.

Figure 4:
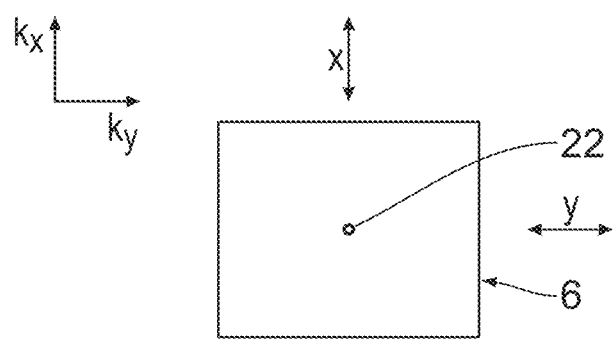
FIG. 4 schematically illustrates a plan view of a displaceable pinhole stop that is arrangeable in a pupil plane of an illumination optical unit of the measurement apparatus.

FIG. 4 shows a variant of a setting stop 6 designed as a pinhole stop with a through opening 22 in the form of a pinhole. A specific illumination direction from which the field of view 10 is illuminated with the measurement light 1 can be selected via the setting stop 6 in accordance with FIG. 4. It is thus possible hereby to determine a reflectivity of the illuminated section of the object 12 from exactly one defined illumination direction.

FIG. 4 again illustrates the displacement degrees of freedom x and y, via which the setting stop 6 can be displaced with the aid of the stop displacement drive 7b.

A reflectivity of the object 12 for the measurement light 1 can be measured with the aid of the reflectivity measurement apparatus 2 as follows: Once the object 12 and the measurement apparatus 2 have been provided, the object 12 is received in the object holder 12a. The section of the object 12 within the field of view 10 is then impinged upon by the beam or bundle of the measurement light 1. The measurement light reflected by the impinged-upon section of the object 12 is captured.

A surface area of the captured section of the object 12 is as large as the field of view 10 and is at most 50 μm×50 μm in the object plane 11. The measurement light reflected by this section of the object 12 is captured by the detector 16. At least one reflectivity parameter of the object 12 is determined on the basis of the measured intensity of the measurement light 1 captured by the detector.

Before the beam of the measurement light 1 impinges on the object section, a selection of a section that is to be impinged upon can be made on the basis of structure details of the object 12, for example targeted impingement on reflective sections of an object that also has absorbing sections or a targeted selection of specific, possibly repeating object structures.

The respective reflectivity parameter can be determined individually for exactly one object 12. Alternatively, a plurality of objects 12 to be compared can be measured sequentially, and a comparison of correspondingly measured reflectivity parameters of different objects 12 can be effected. For this purpose, the object 12 to be measured can be compared to a calibration object that was calibrated in advance. A reflectivity parameter that is determined during the measurement method can be, for example, an absolute reflectivity of the object 12.

To the extent that a lithography mask with a pellicle is measured as the object 12, a transmission of the pellicle can also be determined. Such a pellicle transmission can be measured locally over a defined section of the pellicle. In this case, a comparison between a reflectivity measurement of the object 12 with and without a pellicle can be effected. The influence of the pellicle on the reflectivity of an object 12 can in particular thus be determined.

During the reflectivity parameter determination, for example a local variation of the reflectivity of the object 12 can be determined by comparing the results of the capturing of the measurement light 1 coming from exactly one captured section of the object 12 by way of the spatially resolved detector. For this purpose, the result of the capturing on the spatially resolved detector is compared for example in a pixel-wise manner.

In this case, for example an intensity maximum value on one of the pixels of the detector 16 can be compared during the measurement light capturing to a minimum value. Such a local reflectivity variation within exactly one captured object section can be visualized by representing the deviations of the respective pixel intensity values from a measured intensity average value. It is possible hereby for example to illustrate whether the local reflectivity variation is a variation having a higher or lower spatial frequency.

Where a lithography mask that is already structured is measured, a reflectivity parameter determination of selected reflective sections of the lithography mask can be effected. In other words, it is possible to select in a targeted manner sections that are to be impinged upon by the measurement light 1 and on which no absorber structures of the lithography mask are located.

A reflectivity variation can also be determined over a surface section of the object 12 that is larger than the field of view 10 of the measurement apparatus 2. Results of the capturing of the measurement light 1 coming from different sections of the object 12 that were captured sequentially with the detector 16 are here compared to one another. The object 12 is displaced in a targeted manner with the aid of the object displacement drive 12b between said sequential capturing operations. It is possible in this way to measure mutually adjoining object sections or object sections that also partially overlap for normalization purposes, wherein, overall, the entire surface of the object 12 can be measured in this way for example by a scanning operation.

The local reflectivity variation can be implemented for example by selecting a grid of 10×10 object sections to be measured that are impinged upon sequentially by the measurement light for the reflectivity measurement.

It is also possible to determine as the reflectivity parameter an angle variation of the reflectivity of the object 12 or of a section thereof. Results of the capturing of the measurement light 1 that impinges upon exactly one captured section of the object 12 at different angles of incidence are compared here. The measurement light capturing in turn is performed by the detector 16.

Such capturing of an impingement on the object section at different angles of incidence can be effected sequentially or simultaneously.

In the case of sequential capturing, an angle variation of the reflectivity is determined by the captured object section being sequentially impinged upon at different angles of incidence. In this case, a pinhole of the type of the setting stop 6 in FIG. 4 can be used.

In the case of the simultaneous measurement, the angle variation of the reflectivity is determined by simultaneous impingement on the captured object section at different angles of incidence. To this end, an image of the pupil after the reflection of the measurement light 1 at the object 12 is captured. This can be done by using the Bertrand optical unit 17 with the Bertrand mirror in the active position.

For normalizing a signal strength of the measurement light 1 that impinges on the object 12, signal strengths at the location of the energy sensors 21a and also signal strengths at the detector 16 can be used. The signal strength at the energy sensor 21a depends on the signal strength of the light source 3, on the reflectivity of the collector 3a and on the transmission of the further illumination optical unit 4a including the setting stop 6. The signal strength at the detector 16 also depends, in addition to said parameters, on the reflectivity of the mask to be determined and on the transmission of the projection optical unit 8, possibly including the Bertrand optical unit 17. The transmission of the projection optical unit 8 possibly including the Bertrand optical unit 17 can be determined by an independent calibration.

A ratio of the signal strengths of the detector device 16 to the signal strengths of the energy sensor 21a depends only on the product of the reflectivity of the object 12 to be determined and the transmission of the projection optical unit 8 possibly including the Bertrand optical unit 17. If this transmission is determined with the aid of a preceding calibration, the normalized reflectivity of the object 12 can be determined.

It is possible to ensure with the aid of the sequentially and/or simultaneously determined angle variation of the reflectivity of the captured object section for example that the pole balance of a qualified object 12 is better than 10%.

It is correspondingly possible to ensure that the ellipticity of a pupil, e.g. a deviation of a pupil peripheral contour from a desired specified boundary shape, for example from a circular shape, is better than 10%.

By using a calibrated object, for example in the form of a calibration mask, in which for example corresponding reflectivity values $R_K(k_x, k_y)$ at the different illumination angles are known for example with the aid of a sequential determination of the angle variation of the reflectivity, it is possible to determine the desired angle variation of the reflectivity $R_O(k_x, k_y)$ of the object 12 to be measured from the measurement values $P_K(k_x, k_y)$ (pupil image of the calibration mask) and $P_O(k_x, k_y)$, by determining the simultaneous pupil images with the use of the Bertrand mirror 18 in the active position, in accordance with the following relationship:

$$R_O(k_x, k_y) = R_K(k_x, k_y) \times \frac{P_O(k_x, k_y)}{P_K(k_x, k_y)}$$

Figure 5:
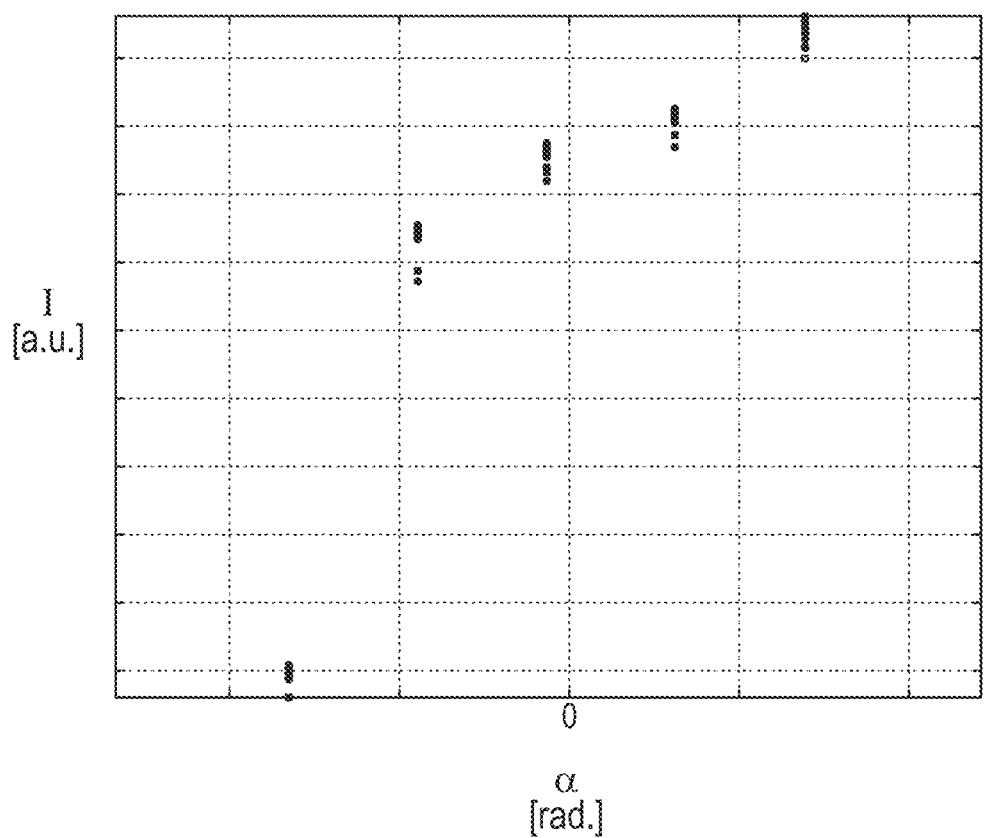
FIG. 5 shows a diagram of a normalized signal strength of measurement light that impinges on the structured object as a measure of the object reflectivity, plotted for different object sections as a function of an illumination angle as a result of a measurement during which a pinhole stop of the type of that of FIG. 4 is used.

FIG. 5 shows the result of corresponding reflectivity measurements as the result of a sequential impingement on a plurality of captured object sections at different angles of incidence. It shows an intensity I as a function of an illumination angle $\alpha$. The value "0" of the illumination angle here symbolizes illumination from the center of the illumination pupil, that is to say along a chief ray CR (cf. FIG. 1) extending through a center of the illumination pupil. Measurement results for different captured object sections at a total of five different illumination angles are shown.

The measurement was performed at different sections of the object 12 that were displaced for this purpose in each case into the field of view 10 of the measurement apparatus 2. The corresponding measurement points are plotted in FIG. 5 using different symbols. The result is a specific bandwidth of the signal strengths that is due to different reflectivities of the respectively measured object sections. For example an average reflectivity of the object 12 during the illumination from the different illumination angles measured can be deduced herefrom.

It additionally shows that the signal strength of the signal I measured by the detector 14 certainly significantly depends, and in particular not linearly, on the angle of incidence. A great change in the reflectivity occurs toward larger absolute angles of incidence (measurement values on the left of FIG. 5).

FIG. 6 shows a further embodiment of a metrology system 25, again designed as a reflectivity measurement apparatus for measuring a reflectivity of an object, in the form of a lithography mask 12, that is to be measured. Components and functions corresponding to those which have already been explained above with reference to FIGS. 1 to 5 bear the same reference signs and will not be discussed in detail again.

FIG. 6 shows a beam path of the measurement light 1 by way of a chief ray CR, drawn as a solid line, of a central field point and by way of two marginal rays, shown in dashes. Said marginal rays in each case delimit a pupil in a pupil plane of the metrology system 25.

The illumination optical unit 4a in the metrology system 25 has a total of three EUV mirrors, denoted in FIG. 6 in the order of impingement thereof by IL1, IL2 and IL3. A filter plane 26 is located between the light source 3 and the first mirror IL1 of the illumination optical unit 4a, in which filter plane for example a debris filter can be arranged that protects optical components downstream in the beam path of the measurement light 1 against radiation components and/or particle components that come from the light source 3 and are undesirably guided along.

An intermediate focal plane 27 of the illumination system 4 is located between the mirrors IL1 and IL2. An intermediate focus IF of the measurement light 1 is arranged here. A pinhole stop that can have a function corresponding to that of the debris filter can be arranged in the intermediate focal plane 27.

A pupil plane 28 of the illumination optical unit 4a is located between the intermediate focal plane 27 and the mirror IL2 of the illumination optical unit 4a. A setting stop for specifying the illumination setting of the metrology system 25 can be arranged in said pupil plane 28.

In the region of the pupil plane 28, that is to say in the pupil plane 28 or adjacent thereto, a plurality of energy sensors or dose sensors 29 are arranged for capturing a dose of the measurement light 1 that is incident on the object 12 during a measurement. The energy sensors 29, which in terms of construction can in principle correspond to the energy sensors 21a, are arranged distributed in the peripheral region of an entire bundle of the measurement light 1 in the circumferential direction around said bundle. A number and a circumferential distribution of the energy sensors 29 around the entire measurement light bundle are selected depending on the requirements in terms of measurement quality of the energy sensors 29 or owing to specific characteristics of the light source 3.

In the embodiment according to FIG. 6, a total of three energy sensors 29 are present in the circumferential direction such that they are distributed uniformly around the entire bundle of the measurement light 1. In variants of the metrology system 25, the number of the energy sensors 29 can also differ from three and can lie in the range between one and twelve, for example. The energy sensors 29 can be located in the circumferential direction with uniform distribution around the entire bundle of the measurement light 1 or with non-uniform distribution if specific circumferential regions of the entire bundle of the measurement light 1 require more intense sensor monitoring than other circumferential regions.

The energy sensors or dose sensors 29 can be designed as pyroelectric sensors.

Together with the projection optical unit 8, the illumination system 4 constitutes the optical measurement system 9 of the metrology system 25. The projection optical unit 8 has a total of three EUV mirrors, denoted in FIG. 6 in the order of impingement thereof by M1, M2 and M3.

Using the detector 16, it is possible depending on the embodiment of the metrology system 25 to realize spatially resolved capturing of the measurement light 1 over the object field 10 and to realize illumination-angle-resolved capturing for example by using a Bertrand optical unit, as was already explained above in connection with FIGS. 1 and 2, with the result that, at each field point, an illumination angle distribution of the measurement light 1 at that field point can be determined with the aid of the detector 16.

A signal capturing and evaluation device 30 of the metrology system 25 has a signal connection to the detector 16 in a manner that has not been illustrated. The signal capturing and evaluation device 30 can additionally have a signal connection to further components of the measurement apparatus 25, in particular to the energy sensors 29 and/or the energy sensors or the energy sensor 21a of the embodiment of FIGS. 1 and 2. In addition, the signal capturing and evaluation device 30 can have a signal connection to the object displacement drive for controlling it.

When using the metrology system 25, image recordings of in each case one section of the object 12 in the object field 10 are made with the aid of the detector 16. The detector 16 thus serves as a camera.

In the metrology system 25, critical illumination of the object 12 is present.

The pixel-wise intensity result of imaging of a structured section of the object 12 that can be obtained for example by processing image results in different focal planes (z-displacement of the object 12 or a displacement corresponding thereto of the image plane 15) with the detector 16 will also be referred to as "Plane" hereinafter. A dose of the measurement light 1 measured in this plane image recording simultaneously with the energy sensor 29 will be referred to as "PlaneDose".

In addition, images of reflective, unstructured sections of the object 12 in the object field 10, whose pixel-wise intensity results are also referred to as "Clear", are recorded with the metrology system 25 using the detector 16. The measurement light dose value captured parallel to the clear measurement using the energy sensors 29 is referred to as "ClearDose".

Owing to a corresponding normalization it is now possible to generate in pixel-wise fashion a normalized ratio between the intensity result of the object structure measurement (plane) and the result of the object blank measurement (clear). This image result that is normalized in pixel-wise fashion is also referred to as "NormPlane".

$$NormPlane = \frac{Plane \times ClearDose}{Clear \times PlaneDose} \quad (1)$$

In the normalization according to this formula (1), a relative intensity is normalized in pixel-wise fashion to the intensity of a blank reference location, which gives a mask-dependent result ("NormPlane"). In addition, influences can result owing to the fact that the plane measurement is effected through a pellicle of the lithography mask 12, whereas the clear measurement is possibly not effected through such a pellicle.

In order to be able to compare objects or lithography masks 12 to one another and also different pellicle configurations, measurement is additionally performed with respect to an absolute reference in the measurement method with the metrology system 25. A correspondingly post-processed image that is less mask-dependent or pellicle-dependent than the previous image "NormPlane" will be referred to hereinafter as "AbsPlane". Here, the following applies:

$$\text{AbsPlane} = \text{Calibration constant} \frac{\text{Plane}}{\text{PlaneDose}} \times \frac{[\text{Clear}]}{\text{Clear}} \quad (2)$$

Additionally in formula (2):
[Clear]: denotes an intensity average value over all the pixel intensity measurement results of the clear measurement;
CalibrationConstant: denotes a calibration factor eliminating temporal fluctuations of the light source 3.

The value "CalibrationConstant" additionally incorporates a reflectivity calibration, as already explained above.

The value "CalibrationConstant" can also incorporate an illumination-setting-dependent calibration, as likewise already explained above in particular in connection with the Bertrand optical unit of the embodiment of the metrology system 2 of FIGS. 1 and 2.

The determination of the value "CalibrationConstant" can incorporate results of image reconstruction algorithms. To this end, in particular an optical phase difference of the measurement light over an object section to be measured can be determined. The phase difference between an absorber structure phase of the measurement light, which is reflected by absorber structures of the object, and a reflector structure phase of the measurement light, which is reflected by reflector structures of the object, can here be determined as a characteristic that is applicable overall over an object structure to be measured. When determining the optical phase difference, a series of 2D images of the object, in each case in different focal planes, can be measured for recording a 3D aerial image of the object and an image-side field distribution can be reconstructed from the 3D aerial image including amplitude and phase of an electric field of the 3D aerial image. The phase difference can then be determined from the reconstructed field distribution with the aid of a phase calibration. Phase measurement systems and measurement methods that can be performed therewith are known from papers "Phase-shift/Transmittance measurements in micro pattern using MPM193EX" by H. Nozawa et al., Photomask and Next-Generation Lithography Mask Technology XVI, proceedings of SPIE Vol. 7379, 737925 and "Phame™: a novel phase metrology tool of Carl Zeiss for in-die phase measurements under scanner relevant optical settings" by S. Perlitz et al., proceedings of SPIE, March 2007, Art. No. 65184 R.

When ascertaining the 3D aerial image, a measurement illumination setting can be specified with the aid of a corresponding setting stop, for example in the pupil plane 28. A measurement illumination setting that differs from a production illumination setting for which the reflectivity values should then be determined with the metrology system can be used during the reconstruction. A conversion between these different illumination settings can then be effected with the aid of an ascertainment algorithm. It is possible here to use a reconstruction method for an object structure known from the technical paper "Method for Retrieval of the Three-Dimensional Object Potential by Inversion of Dynamical Electron Scattering" by Van den Broek et al., Phys. Rev. Lett 109, 245502 (2012) and also from WO 2017/207 297 A1.

The measurement results "AbsPlane" are then comparable in terms of the actual reflectivities of the structured object section. It is possible in this way to determine mask effects, that is to say effects brought about by different masks, and pellicle effects.

Figure 7:
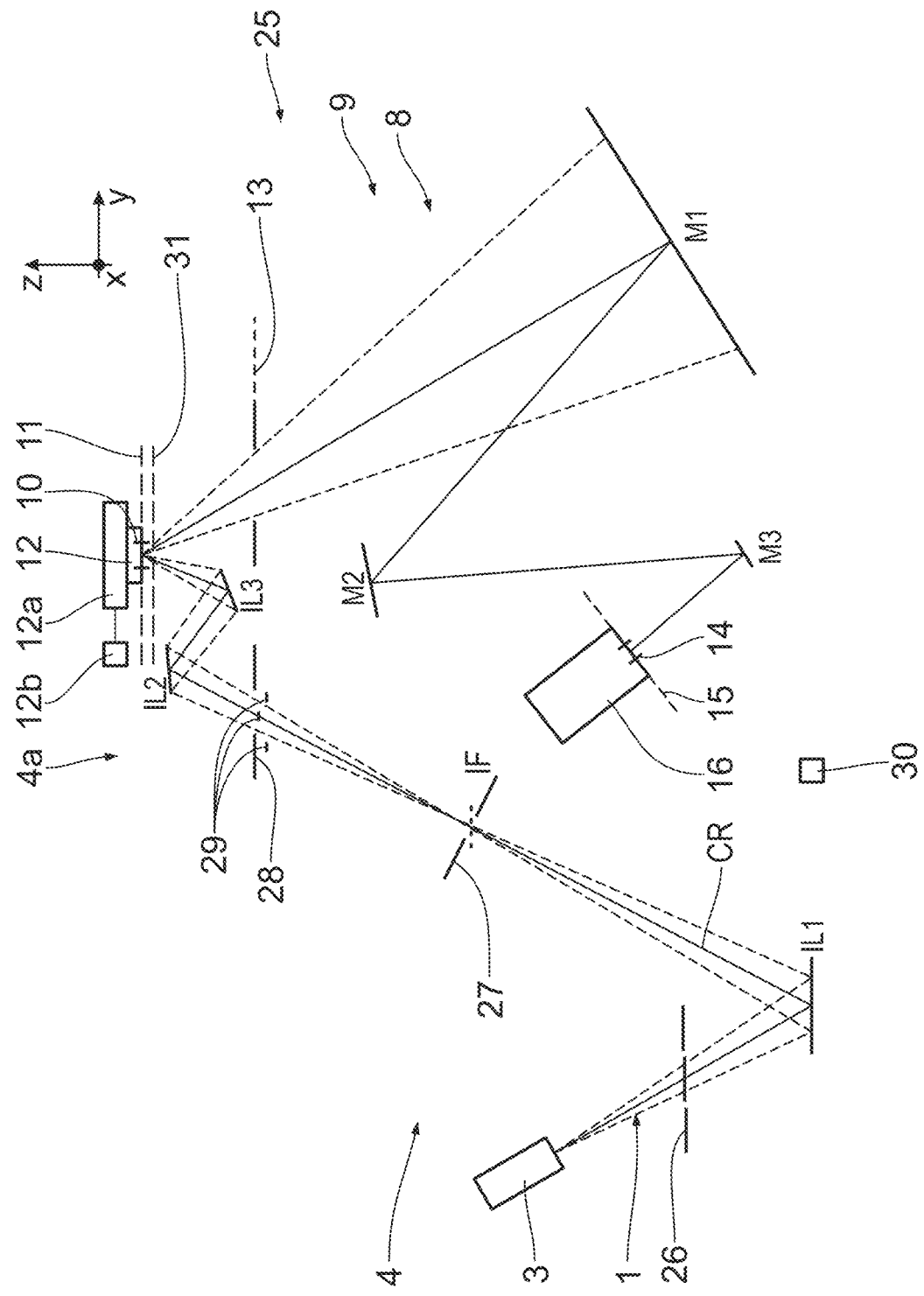
FIG. 7 shows in an illustration similar to FIG. 6 the metrology system of FIG. 6 during a measurement of an object in the form of a lithography mask having a pellicle.

FIG. 7 shows the measurement system 25 when measuring a lithography mask or a reticle 12 with a pellicle 31.

It is possible with the aid of the metrology system 25 for example to measure a change in transmission or an apodization owing to the use of the pellicle 31. Before the pellicle 31 is attached, the respective reticle 12 is measured at a predetermined number of scanning positions. These scanning positions can be different structured object sections and/or unstructured object sections. The detector 16 is then used to record in pixel-wise manner in each case the reflected light intensity of the measurement light 1. Next, the pellicle 31 is attached to the reticle 12, and the reticle 12 is then measured again at the same scanning position. It is then possible to reach a conclusion relating to transmission and/or apodization changes produced by the pellicle 31 from the resulting intensity changes. Conclusions relating to the design of the pellicle 31 can then be drawn.

In a measurement variant, reflectivities of two different objects 12, for example two different lithography masks or reticles, can be compared. In this case, the same or similar structures, located at identical or similar scanning positions of the objects 12 to be compared, on said two objects 12 are measured. Conclusions relating to the relative or the absolute differences in the reflectivities between the two objects 12 are then drawn from the comparison of the measured "AbsPlane" images in accordance with the explanations relating to the above formula (2). It is then in turn possible to draw conclusions with respect to materials and production processes for producing the objects 12.

In a further measurement variant, a reflectivity of an object 12, for example a lithography mask or a reticle, is measured at different times. The same or similar structures on the object 12 are in this case measured at different times during a utilization duration of the object 12, and in this way possible reflectivity changes over the time or over a number of uses, for example over a number of exposed wafers, are quantified. By comparing reflectivity changes at different object (scanning) positions, it is correspondingly possible to determine position-dependent changes and to draw conclusions for the design of future objects 12 therefrom.

What is claimed is:

1. A method for measuring a reflectivity of an object, embodied in the form of a structured lithography mask or as an unstructured mask blank, for measurement light, the method comprising the following steps:
   providing the object,
   providing a reflectivity measurement apparatus,
      having a measurement light source,
      having an object holder for holding the object,
      having a spatially resolving detector for capturing measurement light reflected by the object in the object holder,
   impingement of a measurement light beam on a section of the object within a field of view of the measurement apparatus, capturing the reflected measurement light coming from the impinged-upon section of the object, wherein a surface area of the captured section is at most 50 µm×50 µm, with the detector, determining at least one reflectivity parameter of the object on the basis of an intensity of the captured measurement light; and determining an angle variation of the reflectivity by comparing results of the capturing of the measurement light impinging on exactly one captured section of the object at different angles of incidence, by way of the spatially resolving detector.

2. The method of claim 1, comprising determining a local variation of the reflectivity of the object by comparing results of the capturing of the measurement light coming from exactly one captured section of the object by way of the spatially resolving detector.

3. The method of claim 1, comprising determining a variation of the reflectivity over a surface section of the object that is larger than the field of view of the measurement apparatus by comparing results of the capturing of the measurement light coming from different sections of the object by way of the spatially resolving detector.

4. The method of claim 1, wherein the angle variation of the reflectivity is determined by sequential impingement on the exactly one captured section at different angles of incidence.

5. The method of claim 1, wherein the angle variation of the reflectivity is determined by simultaneous impingement on the exactly one captured section at different angles of incidence.

6. The method of claim 1, comprising normalizing a signal strength of the measurement light impinging on the object.

7. A metrology system for carrying out a method according to claim 1, the metrology system comprising:
the measurement light source,
an illumination optical unit for illuminating the object to be measured, embodied as a structured lithography mask or an unstructured mask blank, with a specified illumination setting,
an imaging optical unit for transferring the measurement light reflected by a section of the object to be examined into a measurement plane, and
the spatially resolving detector, arranged in the measurement plane;
wherein the metrology system is configured to determine an angle variation of the reflectivity by comparing results of the capturing of the measurement light impinging on exactly one captured section of the object at different angles of incidence, by way of the spatially resolving detector.

8. The metrology system of claim 7, wherein the measurement light source is designed in the form of an EUV measurement light source.

9. The metrology system of claim 7, comprising a pinhole stop as a constituent part of the illumination optical unit.

10. The metrology system of claim 7, comprising a Bertrand optical unit in a measurement light beam path between the object and the spatially resolving detector.

11. The metrology system of claim 7, comprising at least one energy sensor for determining a signal strength of the measurement light in a beam path before impingement on the object.

12. The metrology system of claim 7 in which the metrology system is configured to determine a local variation of the reflectivity of the object by comparing results of the capturing of the measurement light coming from exactly one captured section of the object by way of the spatially resolving detector.

13. The metrology system of claim 7 in which the metrology system is configured to determine a variation of the reflectivity over a surface section of the object that is larger than the field of view of the measurement apparatus by comparing results of the capturing of the measurement light coming from different sections of the object by way of the spatially resolving detector.

14. The metrology system of claim 7 in which the metrology system is configured to determine the angle variation of the reflectivity by sequential impingement on the exactly one captured section at different angles of incidence.

15. The metrology system of claim 7 in which the metrology system is configured to determine the angle variation of the reflectivity by simultaneous impingement on the exactly one captured section at different angles of incidence.

16. The metrology system of claim 7 in which the metrology system is configured to normalize a signal strength of the measurement light impinging on the object.

17. The metrology system of claim 8, comprising a Bertrand optical unit in a measurement light beam path between the object and the spatially resolving detector.

18. The metrology system of claim 8, comprising at least one energy sensor for determining a signal strength of the measurement light in a beam path before impingement on the object.

* * * * *